United States Patent [19]
Tsubota

[11] Patent Number: 6,099,238
[45] Date of Patent: Aug. 8, 2000

[54] TWO-ARMED TRANSFER ROBOT

[75] Inventor: Ryusuke Tsubota, Sakai, Japan

[73] Assignee: Daihen Corporation, Osaka, Japan

[21] Appl. No.: 09/030,112

[22] Filed: Feb. 25, 1998

[30] Foreign Application Priority Data

May 30, 1997 [JP] Japan ..................................... 9-157570

[51] Int. Cl.[7] ................................................. B66C 23/00
[52] U.S. Cl. ........................... 414/744.5; 901/15; 901/29; 74/490.06
[58] Field of Search ............................. 414/744.5, 744.6; 901/15, 28, 29; 74/490.01, 490.04, 490.08, 490.06, 490.09

[56] References Cited

U.S. PATENT DOCUMENTS

| | | |
|---|---|---|
| 5,083,896 | 1/1992 | Uehara et al. . |
| 5,151,008 | 9/1992 | Ishida et al. . |
| 5,333,986 | 8/1994 | Mizukami et al. . |
| 5,421,695 | 6/1995 | Kimura . |
| 5,439,547 | 8/1995 | Kumagai . |
| 5,636,963 | 6/1997 | Haraguchi et al. . |
| 5,647,724 | 7/1997 | Davis, Jr. et al. . |
| 5,725,352 | 3/1998 | Tanaka .................................. 414/744.5 |
| 5,765,444 | 6/1998 | Bacchi et al. ..................... 414/744.5 X |
| 5,813,823 | 9/1998 | Hofmeister . |

FOREIGN PATENT DOCUMENTS

| | | | |
|---|---|---|---|
| 4-87785 | 3/1992 | Japan ................................. 414/744.5 |
| 7-142552 | 6/1995 | Japan . |
| 8-71965 | 3/1996 | Japan . |

*Primary Examiner*—Donald W. Underwood
*Attorney, Agent, or Firm*—Merchant & Gould P.C.

[57] ABSTRACT

A two-armed transfer robot includes a first arm mechanism and a second arm mechanism. Each arm mechanism has a handling member for carrying a workpiece. The robot further includes a stationary base member and four shafts rotatable about a common vertical axis. Driving devices for the respective shafts are attached to the base frame. The first and second arm mechanisms are actuated upon rotation of the shafts driven by the driving devices. When the shafts are rotated in a same direction, the handling members of the arm mechanisms are caused to pivot about the common vertical axis. When the shafts are rotated in opposite directions, the handling members are caused to linearly move toward or away from the axis. The two arm mechanisms are vertically spaced from each other, so that they do not interfere with each other.

2 Claims, 11 Drawing Sheets

6,099,238

TWO-ARMED TRANSFER ROBOT

BACKGROUND OF THE INVENTION

1. Field of the Invention

The present invention relates to a two-armed transfer robot useful for semi-conductor manufacturing equipment, liquid crystal display processing equipment and the like. More particularly, the present invention relates to a two-armed transfer robot for transferring workpieces between processing chambers under a vacuum

2. Description of the Related Art

In general, transfer robots are used for semi-conductor manufacturing equipment, liquid crystal display processing equipment and the like. The robot has at least one arm mechanism provided with a handling member. An object to be processed or workpiece such as a silicon wafer is placed on the handling member. The arm mechanism is capable of moving horizontally in a straight line as well as rotating in a horizontal plane. A plurality of processing chambers for performing various kinds of processing are arranged around a rotation axis of the robot. With the use of the transfer robot, the workpiece is suitably brought to and taken away from a selected one of the processing chambers.

For improving the efficiency of the transferring operation, use is made of the so-called two-armed transfer robot having two arm mechanisms. Each arm mechanism has a free end provided with a handling member.

A conventional two-armed transfer robot is disclosed in Japanese Patent Application Laid-open No. 7(1995)-142552 for example.

Referring to FIGS. 10–13 of the accompanying drawings, the prior art robot includes a stationary base frame 80, an inner frame 81 arranged to rotate horizontally about an axis $O_1$ relative to the base frame 80 by a suitable driving device, and a first arm 82 supported rotatably about a first axis $P_1$ extending in parallel to the axis $O_1$ of the inner frame 81. The first arm 82 is rotated by a suitable driving device attached to the inner frame 81.

Reference numeral 83 indicates a second arm which is rotatable relative to the first arm 82 about a second axis $Q_1$ extending in parallel to the first axis $P_1$, while reference numeral 84A indicates a handling member which is rotatable relative to the arm 83 about a third axis $R_1$ extending in parallel to the second axis $Q_1$. Reference numeral 85 indicates a first rotation-transmitting member fixed to the inner frame 81 coaxially with the first axis $P_1$, while reference numeral 86 indicates a second rotation-transmitting member fixed to the second arm 83 coaxially with the second axis $Q_1$. Reference numeral 87 indicates a third rotation-transmitting member fixed to the first arm 82 coaxially with the second axis $Q_1$, while reference numeral 88 indicates a fourth rotation-transmitting member fixed to the handling member 84 coaxially with the third axis $R_1$.

A first connecting member 89 is provided between the first rotation-transmitting member 85 and the second rotation-transmitting member 86, while a second connecting member 90 is provided between the third rotation-transmitting member 87 and the fourth rotation-transmitting member 88. The distance S between the first and second axes is equal to the distance S between the second and third axes. The radius ratio of the first rotation-transmitting member 85 to the second rotation-transmitting member 86 is 2 to 1. The radius ratio of the fourth rotation-transmitting member 88 to the third rotation-transmitting member 87 is also 2 to 1.

Chain sprockets or pulleys may be used for the first to fourth rotation-transmitting members 85–88. Correspondingly, the first and second connecting members 89, 90 may be chains or timing belts.

The first arm mechanism 91 is made up of the above elements 82–90. A second arm mechanism 92, which is symmetrical to the first arm mechanism with respect to the X—X line, is supported for rotation about the second axis $P_2$ extending in parallel to the axis $O_1$.

Thus, the distance between the axis $O_1$ and the first axis $P_1$ is equal to that between the axis $O_1$ and the second axis $P_2$. The two-armed transfer robot is made up of the above elements 80–92.

The operations of the first and second arm mechanisms 91 and 92 of the transfer robot are symmetrical with respect to the X—X line and substantially the same. Therefore, description will be made to the operation of the first arm mechanism 91 below.

First, suppose that the inner frame 81 is kept stationary to the fixed base frame 80, and that the first, the second and the third axes $P_1$, $Q_1$ and $R_1$ are initially located on a common straight line, as shown in FIG. 12. Starting from this state, the first arm 82 is rotated counterclockwise through an angle θ about the first axis $P_1$.

As the result of the above operation, the first rotation-transmitting member 85 is stationary, while the second axis $Q_1$ is rotated counterclockwise through the angle θ to be brought to the $Q_{11}$ position. At this time, the $Y_1$-side part of the first connecting member 89 is wound around the first rotation-transmitting member 85, whereas the $Y_2$-side part of the first connecting member is unwound from the first rotation-transmitting member 85.

Thus, the first connecting member 89 is shifted in the direction indicated by arrows $a_1$ and $a_2$. As a result, the second rotation-transmitting member 86 is rotated clockwise about the second axis $Q_1$.

As previously mentioned, the radius ratio of the first rotation-transmitting member 85 to the second rotation-transmitting member 86 is 2 to 1. Thus, when the first arm 82 is rotated counterclockwise about the first axis $P_1$ through the angle θ, the second rotation-transmitting member 86 is rotated clockwise about the second axis $Q_{11}$ through an angle 2θ.

In the above instance, since the second rotation-transmitting member 86 is fixed to the second arm 83, the second rotation-transmitting member 86 and the second arm 83 are rotated clockwise about the second axis $Q_1$ through the angle 2θ.

If the second arm 83 is not moved relative to the first arm 82, the third axis is brought to the $R_{11}$, position shown by broken lines when the first arm 82 is rotated counterclockwise about the first axis $P_1$ through an angle θ, starting from the initial state where the first, the 'second and the third axes $P_1$, $Q_1$, $R_1$ are positioned on the same line. Actually, however, the second rotation-transmitting member 86 is rotated clockwise about the second axis $Q_{11}$ through an angle 2θ. Therefore, the third axis $R_{11}$ is rotated clockwise about the second axis $Q_{11}$ through the angle 2θ, and brought to the $R_{12}$ position.

As a result, when the first arm 82 is rotated counterclockwise about the first axis $P_1$ through the angle θ the third axis $R_{12}$ is still located on the straight line extending through the first and the third axis $P_1$ and $R_1$.

Further, when the second arm 83 is rotated clockwise about the second axis $Q_{11}$ through the angle 2θ to be brought to the $R_{12}$ position, the $Y_2$-side part of the second connecting member 90 is wound around the third rotation-transmitting member 87, whereas the $Y_1$-side part of the second connecting member is unwound from the third rotation-transmitting member 87.

As a result, the second connecting member 90 is shifted in the direction $b_1$–$b_2$ as shown in FIG. 12. Thus, the fourth rotation-transmitting member 88 is rotated counterclockwise about the third axis $R_{12}$.

When the second arm 83 is rotated clockwise about the second axis $Q_{11}$ through an angle 2θ as described above, the fourth rotation-transmitting member 88 is rotated counterclockwise about the third axis $R_{12}$ through an angle θ since the radius ratio of the fourth rotation-transmitting member 88 to the third rotation transmitting member 87 is 2 to 1. As a result, a predetermined point $C_0$ of the fourth rotation-transmitting member 88 is brought to a point $C_1$ on the straight line passing through the first and the third axes $P_1$ and $R_{12}$.

As described above, the first arm 82 is rotated counterclockwise about the first axis $P_1$, and the first arm mechanism 91 is actuated in the X-direction, while the handling member 84 fixed relative to the fourth rotation-transmitting member 88 keeps its initial attitude as being moved along the line passing through the first and the third axes $P_1$ and $R_1$.

Likewise, the second arm mechanism 92 is actuated in the X-direction, while keeping its initial attitude along the line passing through the first and the third axes.

The handling members 84A, 84B of the first and the second arm mechanisms 91, 92 are fixed between the axis $P_1$ and the axis $P_2$. Further, the extremities of the handling members 84A, 84B are vertically spaced from each other. Thus, when the first and the second arm mechanisms 91, 92 are moved in a straight line, the handling members 84A, 84B are moved along the X—X line passing through the axis $O_1$ without interfering with each other.

When the inner frame 81 is rotated about the axis $O_1$, the first and the second arm mechanisms 91, 92 are simultaneously rotated about the axis $Q_1$.

A suitable number (six for example) of processing chambers 71–76 are arranged around the axis $O_1$ of the two-armed transfer robot. With such an arrangement, transferring and processing operations for workpieces are performed.

However, according to the prior art teaching, the rotation radius of the inner frame 81 is rather large since the axis $P_1$ of the first arm mechanism 91 and the axis $P_2$ of the second arm mechanism 92 are spaced from each other, with the axis $O_1$ of the inner frame 81 located therebetween.

Therefore, the bearings 93 facilitating the rotation of the inner frame 81 relative to the base frame 80 have an unfavorable large diameter. The magnetic fluid seal 94 used for sealing the rotating portion suffers the same problem. Consequently, the overall size of the robot is increased, and the price of the robot is high due to the use of the large bearings 93 and magnetic fluid seal 94.

Further, the driving devices for linearly moving the handling members 84A, 84B of the first and the second arm mechanisms 91, 92 are mounted on the inner frame 81. Thus, the driving devices are rotated together with the inner frame 81. For supplying thus arranged driving devices with electricity, use is made of a cable extending from the base frame 80. Thus, the rotation angle or the number of rotations of the inner frame 81 is limited to prevent the cable from breaking.

A suitable monitoring device is needed for preventing the inner frame 81 from rotating clockwise or counterclockwise beyond a predetermined critical angle (540° for example). The use of such a monitoring device makes the robot expensive. More importantly, the monitoring device does not serve to facilitate the operation of the robot since the device cannot remove the above limitation on the rotation angle of the inner frame.

Further, there is another problem involved in the arrangement where the first and second arm mechanisms 91, 92 are simultaneously rotated together with the inner frame 81.

Specifically, referring to FIG. 13, the following are assumed. Silicon wafers to be processed are initially stored in the chamber 72. Upon successive actuation of the first and second arm mechanisms 91, 92, two wafers are placed on the first and second handling members 91, 92, respectively. One of the wafers will be transferred to the processing chamber 73 and the other to the chamber 71.

In such an instance, the inner frame 81 mounting the first and second arm mechanisms 91, 92 is rotated through a suitable angle. Then, the wafer carried by the first arm mechanism 91 is shifted to the chamber 73.

Thereafter, the inner frame 81 is rotated so that the second arm mechanism 92 faces the chamber 71. Then, the wafer carried by the second arm mechanism is shifted to the chamber 71.

In the above instance, the chamber 71 has a long waiting time before the operation to the chamber itself is started. Specifically, the waiting time includes a rotation time needed for the inner frame 81 to rotate from the chamber 72 to the chamber 73, a shift time needed for the first arm mechanism 91 to move the wafer into the chamber 73, and an idle rotation time needed for the inner frame 81 to rotate from the chamber 73 to the chamber 72.

As is easily understood, the above waiting time will become longer as the distance between two selected chambers become greater. In addition, the same operation as described above may be repeated with respect to all of the chambers 71–76. Thus, the total waiting time accumulated through the working hours is considerably long.

Under these circumstances, the advent of a two-armed transfer robot exhibiting a shorter waiting time and good productivity has been desired.

SUMMARY OF THE INVENTION

It is, therefore, an object of the present invention to provide a compact, inexpensive two-armed transfer robot which is easy to operate and has good productivity.

According to a first aspect of the present invention, there is provided a two-armed transfer robot comprising a first arm mechanism and a second arm mechanism. Each arm mechanism has an extremity provided with a handling member for carrying a workpiece to be processed. The handling member is arranged to linearly move in a horizontal plane as well as rotate in the horizontal plane.

The robot further includes: a stationary base member; first to fourth shafts rotatable about a common vertical axis, each shaft being supported by the base member; first to fourth driving devices associated with the first to fourth shafts, respectively, each driving device being attached to the base frame; a first arm mechanism including a pair of first arm links each having a base end and an extremity, a pair of second arm links each having a base end and an extremity, and a first handling member, the base ends of the first arm links being connected respectively to the first shaft and the second shaft, the base ends of the second arm links being connected respectively to the extremities of the first arm links for pivotal movement around vertical axes, the extremity of each second arm link being provided with a rack, the first handling member being connected to the extremities of the respective second arm links via a bearing-connector mechanism in a manner that the racks of the respective second arm links are held in mesh with each other; a second arm mechanism including a pair of third arm links each being substantially identical to the first arm link and having a base end and an extremity, a pair of fourth arm links each being substantially identical to the second arm link and having a base end and an extremity, and a second handling member, the base ends of the third arm links being connected respectively to the third shaft and the fourth shaft, the base ends of the fourth arm links being connected respectively to the extremities of the third arm links for pivotal movement around vertical axes, the extremity of each fourth arm link being provided with a rack, the second handling member being connected to the extremities of the respective fourth arm links via a bearing-connector mechanism in a manner that the racks of the respective fourth arm links are held in mesh with each other; a first controlling unit for synchronously actuating the first driving device and the second driving device in a same direction as well as opposite directions; a second controlling unit for synchronously actuating the third driving device and the fourth driving device in a same direction as well as opposite directions; and the first arm links being vertically spaced from the third arm links, the second arm links being arranged in a vertical facing relation to the fourth arm links, the first handling member being arranged in a vertical facing relation to the second handling member.

The bearing-connector mechanism provided at the extremity of a corresponding arm link may be made small in thickness and includes a through-hole vertically extending through the extremity of the corresponding arm link, a circular plate smaller in diameter than the through-hole so the plate is inserted into the through-hole, a circular groove formed between an inner wall of the through-hole and an outer wall of the circular plate when the place is held in the through-hole, a passage formed at the extremity of the corresponding arm link to communicate with the circular groove, a plurality of balls inserted into the circular groove via the passage, and a stopper to block the passage for preventing the inserted balls from coming out.

Preferably, each of the first to fourth shafts may be rotatably supported via a magnetic fluid seal for hermetic sealing.

According to a second aspect of the present invention, there is provided a two-armed transfer robot comprising: a stationary base member; first to fourth shafts rotatable about a common axis, each shaft being supported by the base member; first to fourth driving devices associated with the first to fourth shafts, respectively; a first arm mechanism including a pair of first arm links, a pair of second arm links pivotably connected to the first arm links, respectively, and a first handling member carried by the second arm links, one of the first arm links being connected to the first shaft, the other of the first arm links being connected to the second shaft; and a second arm mechanism including a pair of third arm links, a pair of fourth arm links pivotably connected to the third arm links, respectively, and a second handling member carried by the fourth arm links, one of the third arm links being connected to the third shaft, the other of the third arm links being connected to the fourth shaft.

Other objects, features and advantages of the present invention will be fully understood from the following detailed description given with reference to the accompanying drawings.

DETAILED DESCRIPTION OF THE PREFERRED EMBODIMENTS

The present invention will now be described in more specific detail referring to the accompanying drawings.

Figure 1:
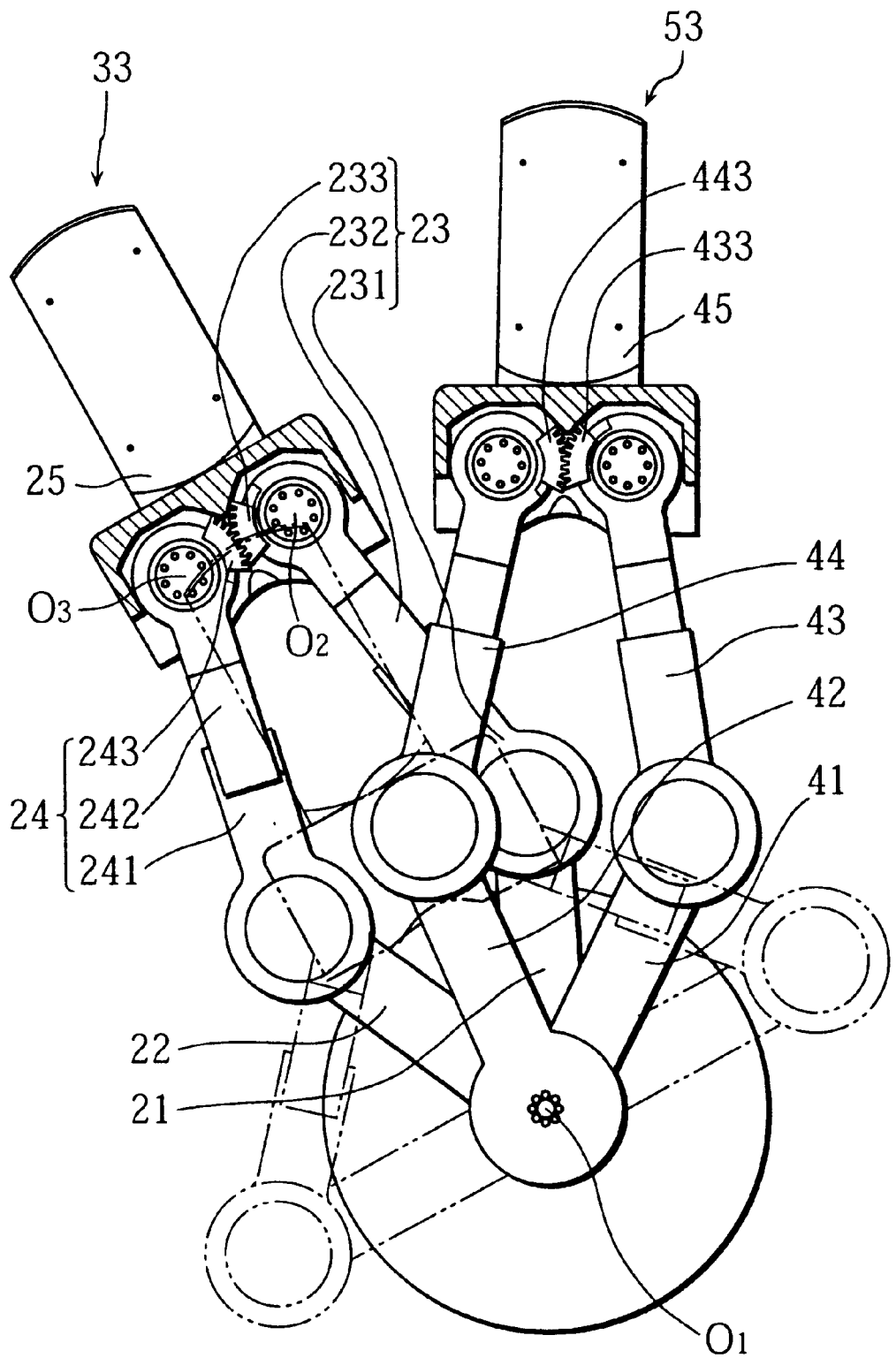
FIG. 1 is a plan view, partly in section, showing a transfer robot according to an embodiment of the present invention.
Figure 2:
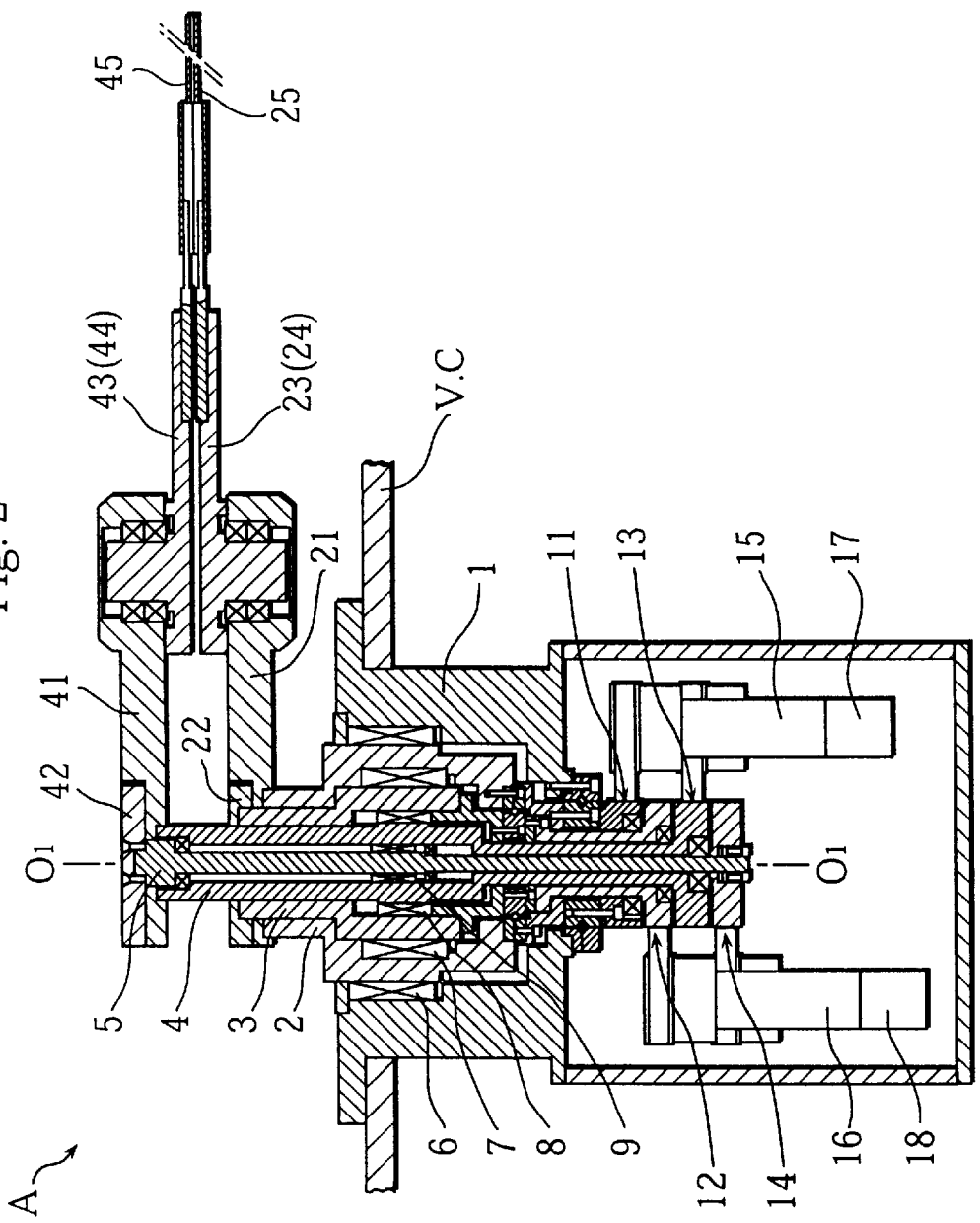
FIG. 2 is a vertical sectional view of the robot shown in FIG. 1.

FIG. 1 is a plan view illustrating a first arm mechanism 33 and a second arm mechanism 53 of a two-armed transfer robot according to the present invention. FIG. 2 is a sectional view showing the same robot generally indicated by reference A. It should be appreciated that the illustrated robot is only one example and therefore may be replaced by a different robot.

Referring to FIG. 2, the robot A has a frame-shaped base member 1 fixed on a floor for example. The base frame 1 is arranged to support first to fourth shafts 2–5 via suitable bearings. The shafts 2–5 are coaxially rotatable about a common vertical axis $O_1$—$O_1$. Typically, the base frame 1 is installed in a vacuum chamber V.C. For maintaining the vacuumed condition in the chamber, magnetic fluid seals 6–9 are provided around the first to fourth shafts 2–5.

First to fourth rotation-transmitting members 11–14 are fixed to the first to fourth shafts 2–5, respectively. The rotation-transmitting members 11–14 are separately driven by first to fourth driving devices 15–18, respectively, via suitable connecting members. The connecting members may be chains or timing belts for example. Correspondingly, the rotation-transmitting members 11–14 may be chain sprockets or timing belt pulleys.

As shown in FIG. 1, the first arm mechanism 33 includes a pair of elongated first arm links 21–22, a pair of elongated second arm links 23–24 pivotably connected to the first arm links 21–22, and a first handling member 25 supported by the second arm links 23–24.

Each of the first arm links 21–22 has an inner end (as viewed radially of the axis $O_1$—$O_1$) and an outer end opposite to the inner end. The inner end of the first arm link 21 is connected to the first shaft 2 (see FIG. 2), while the inner end of the other first arm link 22 is connected to the second shaft 3.

The second arm link 23 includes a base member 231, an extension member 232, and an arcuate rack 233. The base member 231 has an enlarged (inner) end and a narrower (outer) end opposite to the enlarged end. The enlarged end of the base member 231 is pivotably connected to the outer end of the first arm link 21.

The extension member 232 has an narrower (inner) end and an enlarged extremity opposite to the narrower end. The narrower end of the extension member 232 is attached to the narrower end of the base member 231. The arcuate rack 233 is provided at a suitable position of the extremity of the extension member 232. Preferably, the extremity of the extension member 232 has a thickness as small as possible, without losing required mechanical strength.

Similarly, the other second arm link 24 includes a base member 241, an extension member 242, and an arcuate rack 243. The base member 241 has an enlarged (inner) end and a narrower (outer) end opposite to the enlarged end. The enlarged end of the base member 241 is pivotably connected to the outer end of the first arm link 22.

The extension member 242 has a narrower (inner) end and an enlarged extremity opposite to the narrower end. The narrower end of the extension member 242 is attached to the narrower end of the base member 241. The arcuate rack 243 is provided at a suitable position of the extremity of the extension member 242. Preferably, the extremity of the extension member 242 has a thickness as small as possible, without losing required mechanical strength.

The arcuate racks 233 and 243 are arranged so that they are brought into mutual engagement when the first arm mechanism 33 is assembled. The first handling member 25 is attached to the second arm links 23–24 via a pair of bearing-connector mechanisms 32 described later with reference to FIGS. 8–9.

The illustrated extension members 232 and 242 have a predetermined same length. However, the extension members may be replaced with another pair of extension members having a different length so that the movable range of the first handling member 25 is varied.

Likewise, the second arm mechanism 53 includes a pair of elongated third arm links 41–42, a pair of elongated fourth arm links 43–44 pivotably connected to the third arm links 41–42, and a second handling member 25 supported by the fourth arm links 23–24.

Each of the third arm links 41–42 has an inner end (as viewed radially of the axis $O_1$—$O_1$) and an outer end opposite to the inner end. The inner end of the third arm link 41 is connected to the third shaft 4 (see FIG. 2), while the inner end of the other third arm link 42 is connected to the fourth shaft 5.

The fourth arm link 43 includes a base member, an extension member, and an arcuate rack 433. The base member has an enlarged (inner) end and a narrower (outer) end opposite to the enlarged end. The enlarged end of the base member is pivotably connected to the outer end of the third arm link 41.

The extension member of the fourth arm link 43 has an narrower (inner) end and an enlarged extremity opposite to the narrower end. The narrower end of the extension member is attached to the narrower end of the base member of the fourth arm link 43. The arcuate rack 433 is provided at a suitable position of the extremity of the extension member. Preferably, the extremity of the extension member has a thickness as small as possible, without losing required mechanical strength.

Similarly, the other fourth arm link 44 includes a base member, an extension member, and an arcuate rack 443. The base member has an enlarged (inner) end and a narrower (outer) end opposite to the enlarged end. The enlarged end of the base member is pivotably connected to the outer end of the third arm link 42.

The extension member of the fourth arm link 44 has a narrower (inner) end and an enlarged extremity opposite to the narrower end. The narrower end of the extension member is attached to the narrower end of the base member of the fourth arm link 44. The arcuate rack 443 is provided at a suitable position of the extremity of the extension member. Preferably, the extremity of the extension member 242 has a thickness as small as possible, without losing required mechanical strength.

The arcuate racks 433 and 443 are arranged so that they are brought into mutual engagement when the second arm mechanism 53 is assembled. The second handling member 25 is attached to the fourth arm links 43–44 via a pair of bearing-connector mechanisms 32 described later with reference to FIGS. 8–9.

The illustrated extension members of the fourth arm links 44–43 have a predetermined same length. However, the extension members may be replaced with another pair of extension members having a different length so that the movable range of the second handling member 45 is varied.

Figure 8:
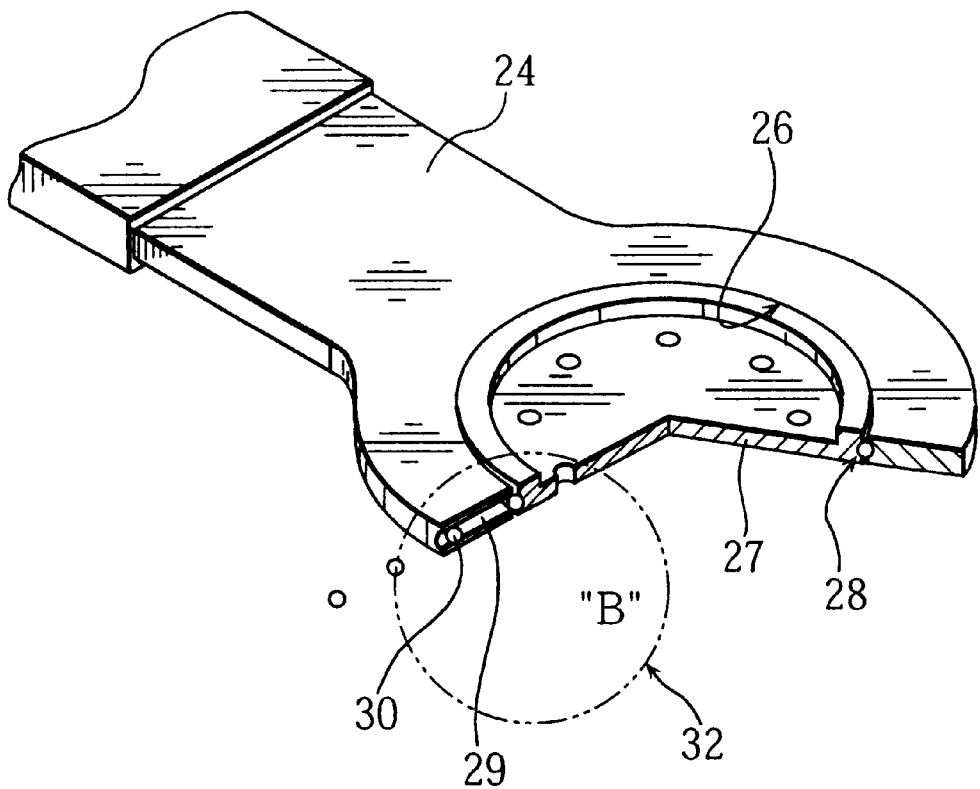
FIG. 8 is a perspective view illustrating a bearing-connector mechanism 32 provided at the extremity of a arm mechanism.
Figure 9:
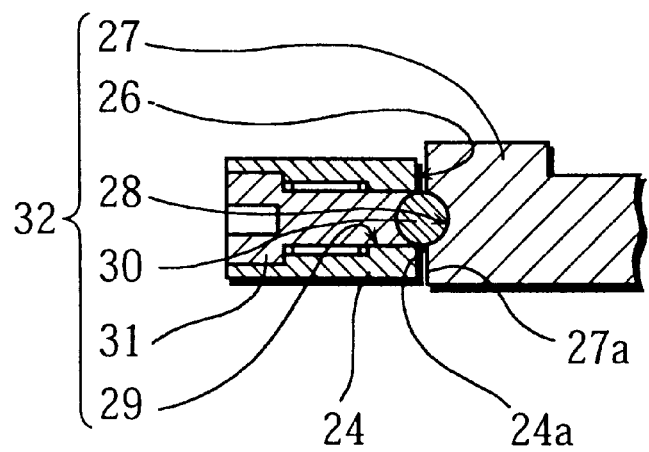
FIG. 9 is an enlarged view of the encircled part shown by B in FIG. 8.
Figure 10:
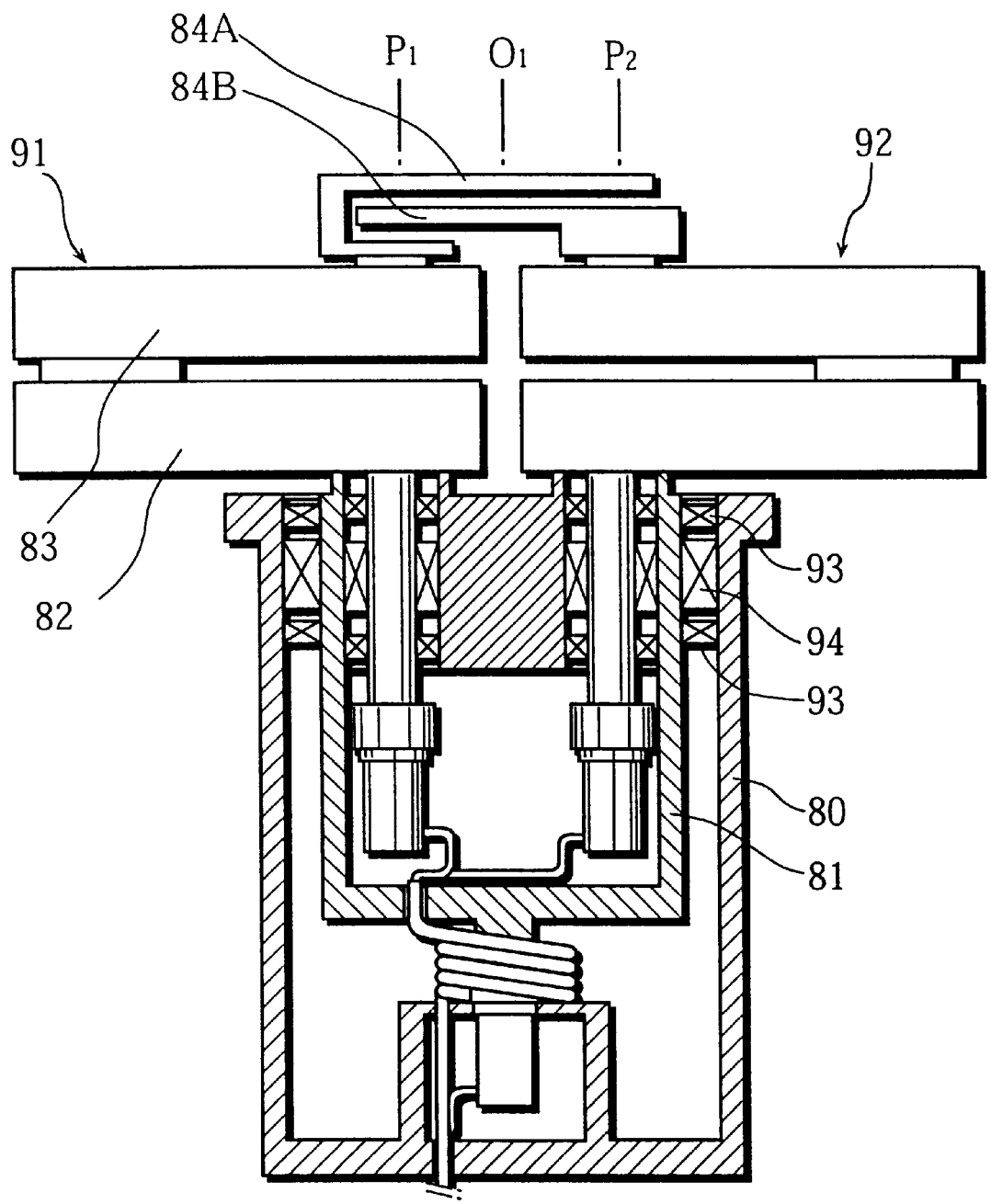
FIG. 10 is a sectional side view showing a principal portion of an prior art robot.
Figure 11:
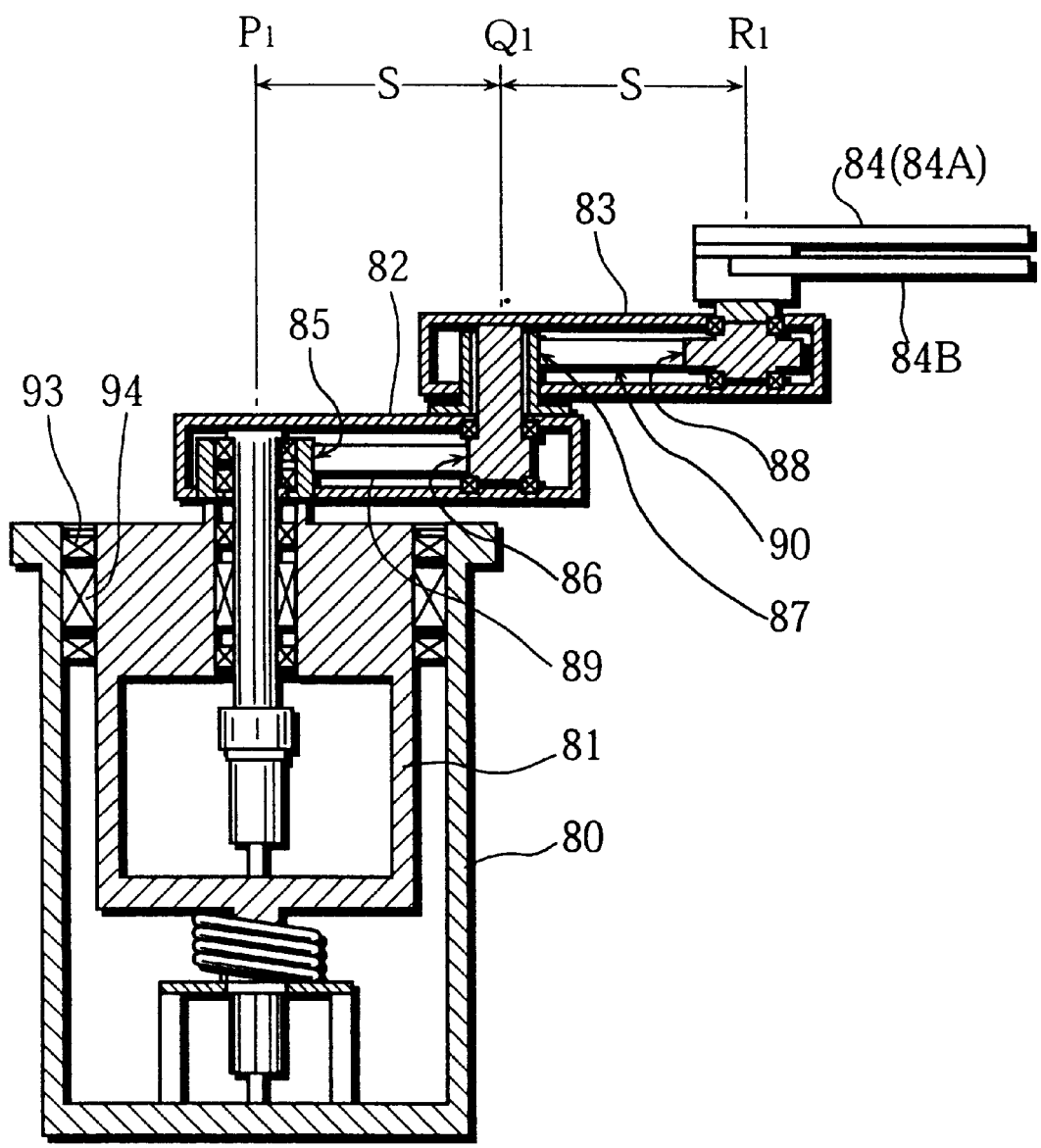
FIG. 11 is a front view showing the robot of FIG. 10 in vertical section.
Figure 12:
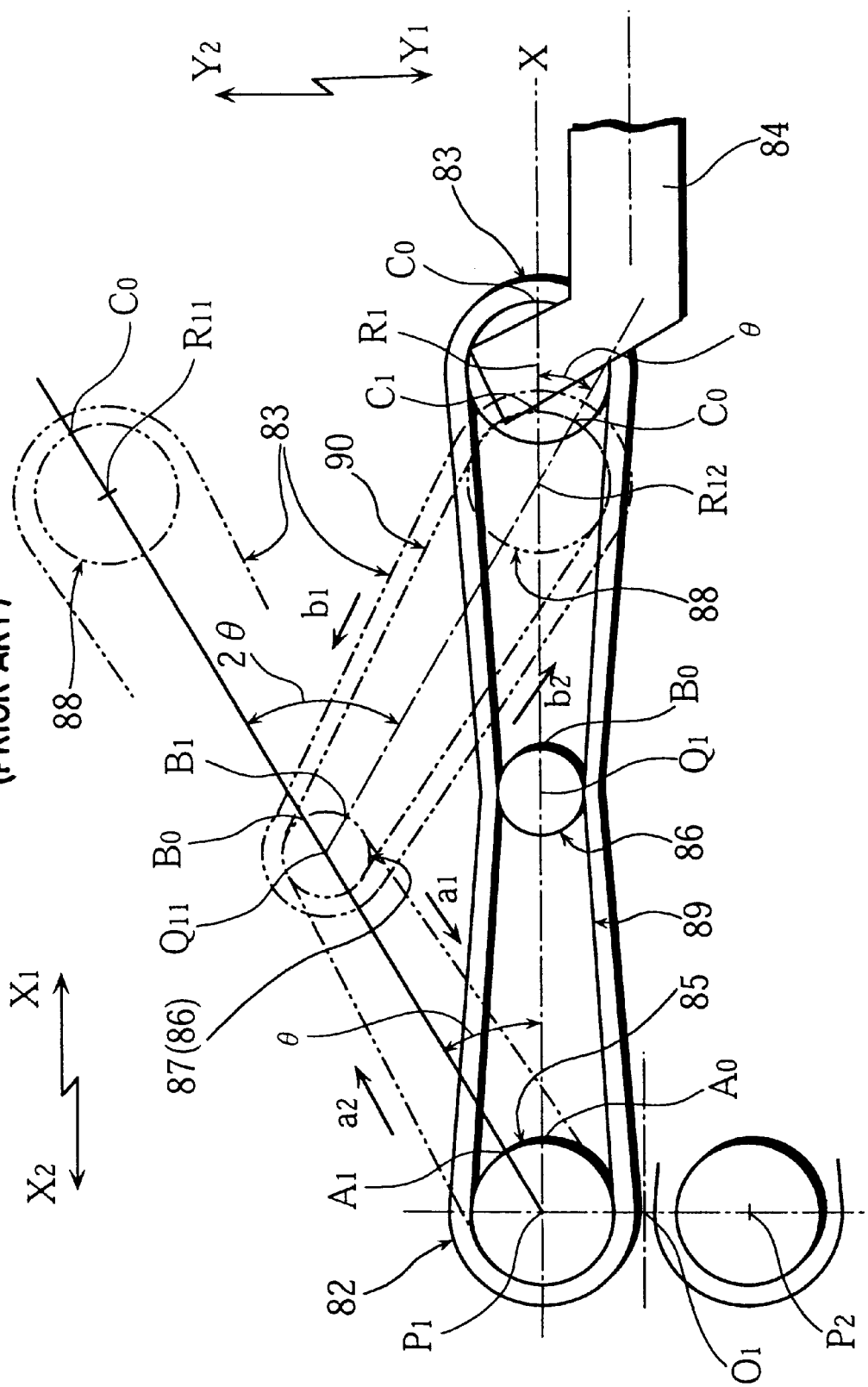
FIG. 12 is a plan view illustrating the movement of the arm mechanism.
Figure 13:
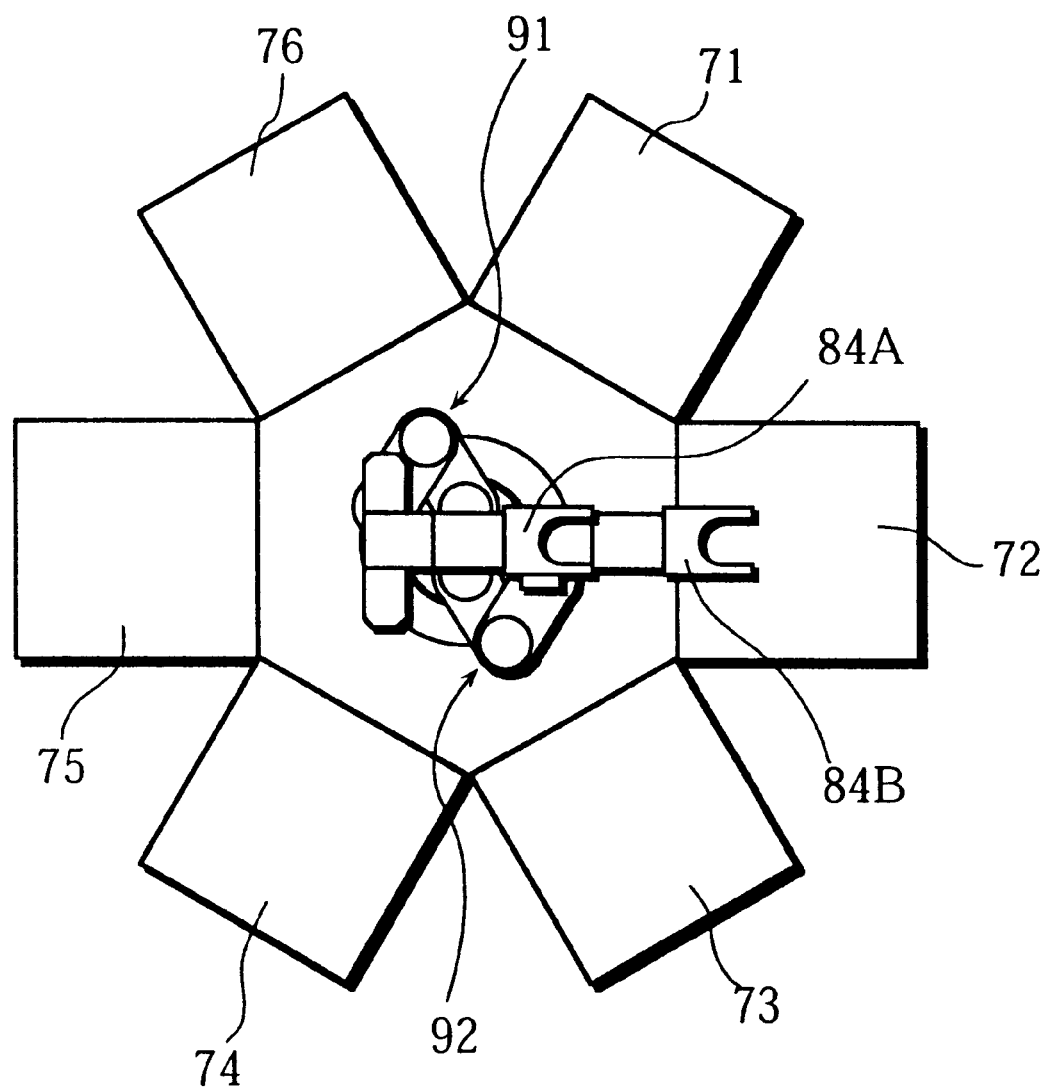
FIG. 13 is a plan view illustrating the robot of FIG. 10 in operation.

Referring to FIGS. 8–9, description is now made to the bearing-connector mechanism 32 mentioned above. The illustrated bearing-connector mechanism is the one provided at the second arm link 24. However, it is apparent that the same mechanisms are provided for each of the other second arm link 23 and the fourth arm links 44–45.

The bearing-connector mechanism 35 includes a through-hole 26 formed at the extremity of the second arm link 24, a circular plate 27 having a diameter smaller than that of the through-hole 26. As is seen from FIG. 9, the maximum thickness of the circular plate 27 is greater than the thickness of the extremity of the second arm link 24. The mechanism 35 also includes a circular groove 28, a passage 29 extending through the thickness of the second arm link 29 to communicate with the circular groove 28, a plurality of rigid balls 30 and a stopper 31. The circular groove 28 and the passage 29 have a suitable diameter large enough to allow passage of each ball 30.

The circular groove 28 is formed by a half groove formed in the circular plate 27 and another half groove formed in the extremity of the second arm link 24. More specifically, as previously described, the extremity of the second arm link 24 is formed with a through-hole 26. As a result, the above extremity has an inner surface 24a defined by the through-hole 26. A groove having a semi-circular cross section is formed on the above inner surface to extend continuously along the same surface. This groove is arranged to partially receive the ball 30 (or the left half of the ball in FIG. 9).

Correspondingly, the circular plate 27 has a circumferential side surface 27a. When the bearing-connector mechanism 32 is assembled, the side surface 27a is brought into facing relation with the inner surface 24a of the extremity of the second arm link 24, as shown in FIG. 9. A groove having a semi-circular cross section is formed on the side surface 27a to extend continuously along the same surface. This groove is also arranged to partially receive the ball 30 (or the right half of the ball in FIG. 9).

As readily understood, the above two grooves complement each other, and form the groove 28 when the plate 27 is inserted into the through-hole 26.

The bearing-connector mechanism 32 of the present invention is assembled as follows. First, the circular plate 27 is fitted into the through-hole 26. With the plate 27 held in place, a suitable number of balls 30 are successively provided into the groove 28 via the passage 29. After the balls 30 are properly distributed along the groove 28, the stopper 31 is fitted into the passage 29 to prevent the balls 30 from rolling out of the groove 28. In this way, the plate 27 is held in place in the through-hole 26, while allowed to rotate smoothly about the central axis of the plate because of the balls 30.

Figure 4:
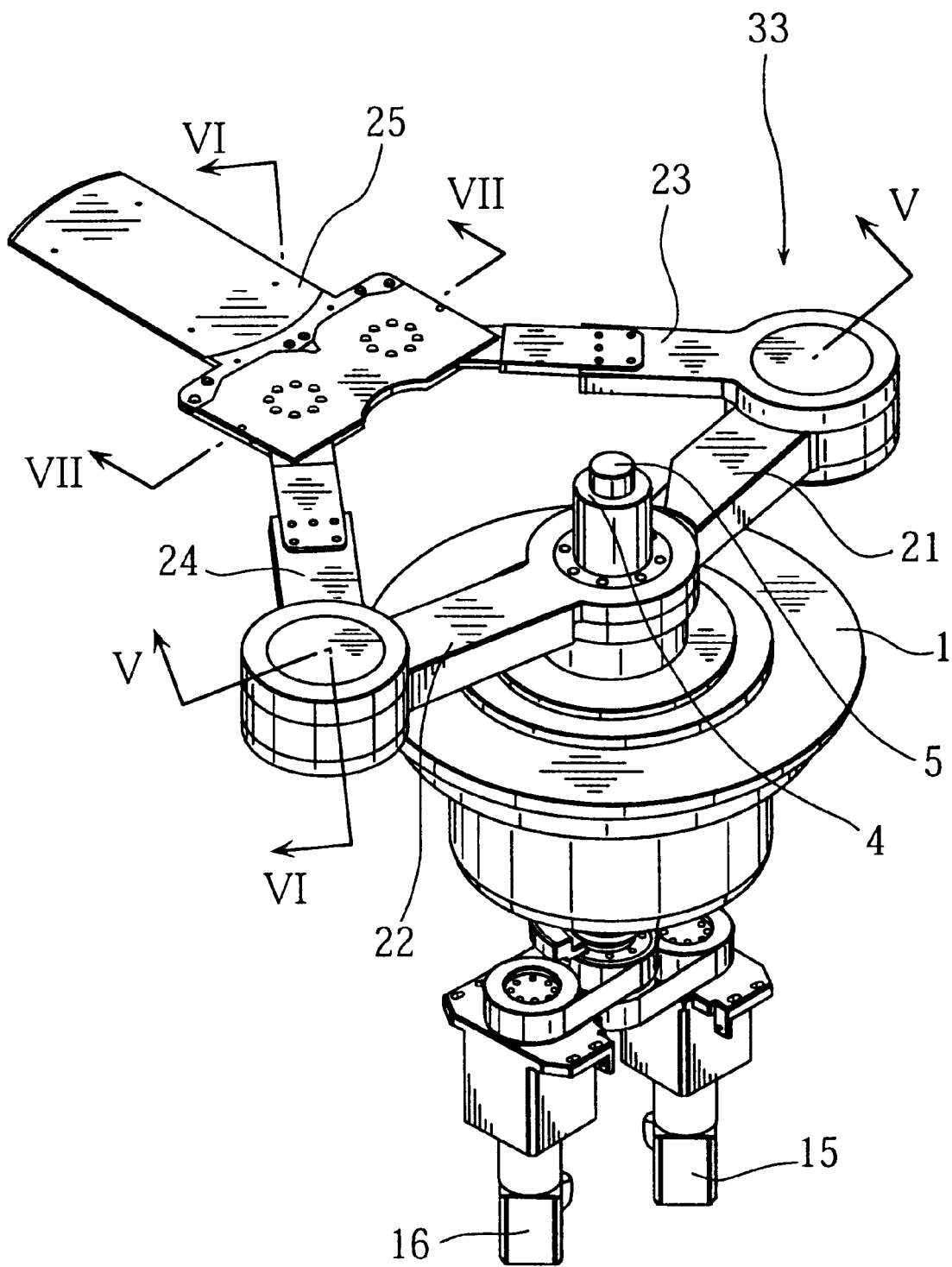
FIG. 4 is a perspective view showing a lower arm mechanism of the same robot.
Figure 5:
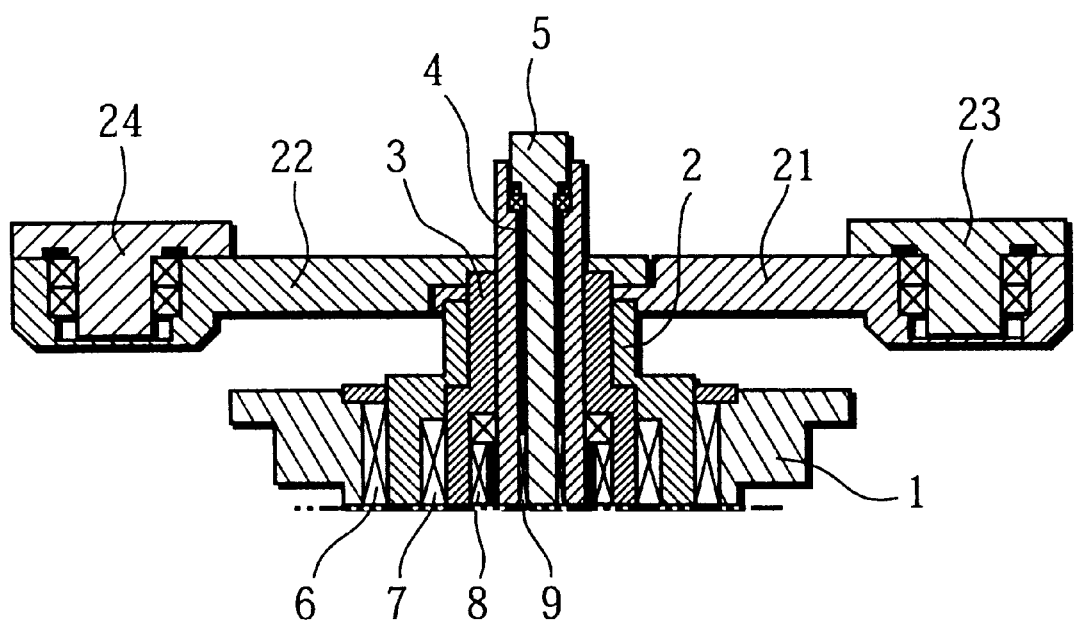
FIG. 5 is a sectional view taken along lines V—V in FIG. 4.
Figure 6:
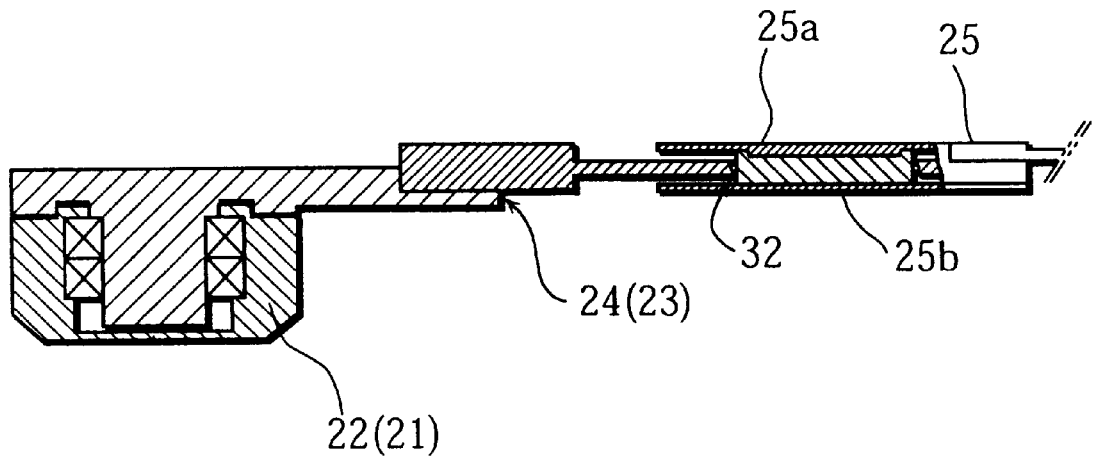
FIG. 6 is a sectional view taken along lines VI—VI in FIG. 4.
Figure 7:
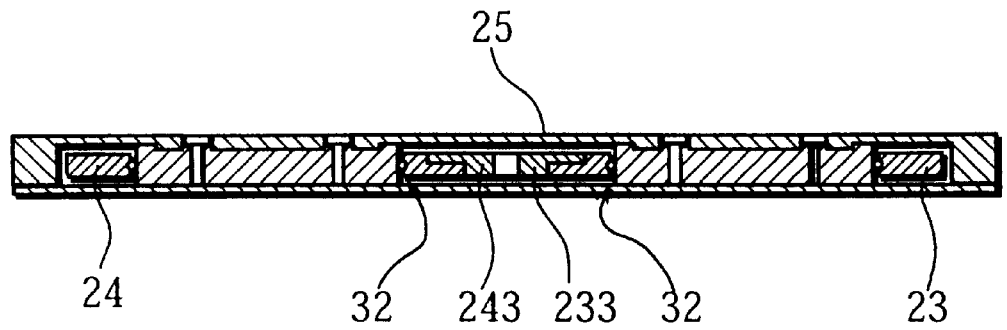
FIG. 7 is a sectional view taken along lines VII—VII in FIG. 4.

After the bearing-connector mechanisms 32 are assembled at the extremities of the second arm links 23 and 24, the first handling member 25 is fixed to the circular plates 27. For this purpose, as shown in FIG. 6, the handling member 25 includes two supporting plates 25a and 25b which are spaced vertically in a parallel relation to each other. The size of the clearance between the supporting plates 25a and 25b is determined so that the circular plate 27 is properly inserted between the supporting plates. After the extremities of the second arm links 23–24 are inserted into the above clearance, with the arcuate racks 233 and 243 held in engagement to each other, the circular plates 27 are fixed to the supporting plates 25a and 25b by riveting for example FIG. 4 shows the assembled state of the handling member 25 to the second arm links 23 and 24.

With such an arrangement, as shown in FIG. 6, the overall thickness of the bearing-connector mechanism 32 and the supporting plates 25a and 25b is made advantageously small.

The second handling member 45 is attached to the fourth arm links 43–44 in the same manner using similar bearing-connector mechanism and supporting plates. Thus, there is no need to separately discuss the second handling member 45 here.

As is seen from FIG. 2, the first arm links 21–22 are vertically spaced downward from the third arm links 41–42. On the other hand, the second arm links 23–24 are arranged close to the fourth arm links 43–44 as viewed vertically, so that they come into a facing relation to the fourth arm links. As a result the first handling member 25 attached to the second arm links also comes into a facing relation to the second handling member 45 attached to the fourth arm links.

Figure 3:
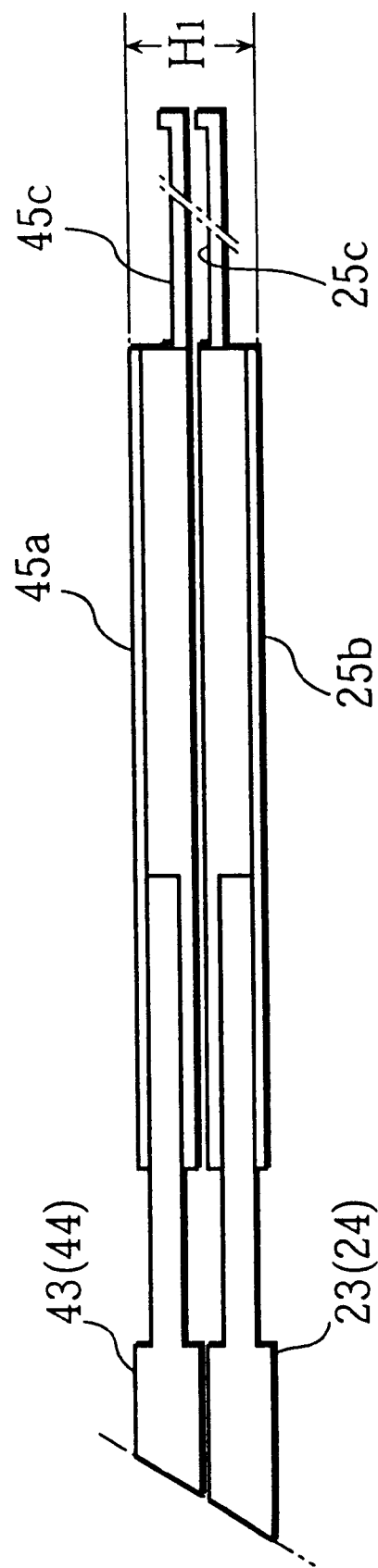
FIG. 3 is an enlarged view showing handling members of the same robot.

With such an arrangement, it is possible to reduce the vertical distance $H_1$ (see FIG. 3) between the upper surface of the supporting plate 45a and the lower surface of the supporting plate 25b. It is preferable that, as shown in FIG. 3, the first and second handling members 25 and 45 have free ends provided with sufficiently large concave portions 25c and 45c. In this way, workpieces to be carried are stably placed on the handling members and transferred by them without dropping from the handling members.

The operation of the first arm mechanism 33 will now be described. As is easily understood, the second arm mechanism 53 can be operated in the same manner.

Referring to FIGS. 1 and 2, when the first and second driving devices 15 and 16 are synchronously actuated in opposite directions, the first arm link 21 and the other first arm link 22 pivot about the axis $O_1$ in opposite directions. More specifically, when the first driving device 15 is caused to rotate clockwise (as viewed from above) and the second driving device 16 is caused to rotate counterclockwise in a synchronous manner, the first arm link 21 is caused to pivot about the axis $O_1$ clockwise and the other first arm link 22 is caused to pivot about the axis $O_1$ counterclockwise, while their rotational angles are equal. When the first arm links 21–22 are moved in the above manner, the inner end of the second arm link 23 is moved clockwise about the axis $O_1$, while the inner end of the other second arm link 24 is moved counterclockwise about the axis $O_1$. However, the extremities of the second arm links 23 and 24 are fixed to the supporting plates 25a and 25b for pivotal movement via the bearing-connector mechanisms 32. Further, the outer ends of the second arm links 23 and 24 are associated with each other via the arcuate racks 233 and 243. Thus, when the first arm link 21 pivots about the axis $O_1$ clockwise and the other first arm link 22 counterclockwise in a synchronous manner, the handling member 25 is moved horizontally toward the axis $O_1$ in a straight path, while the attitude of the same member is unchanged.

Then, when the handling member 25 is drawn toward the axis $O_1$ to a predetermined extent, the first and second driving devices 15–16 are turned off. As a result, the handling member 25 is held at a position (indicated by broken lines in FIG. 1) closer to the axis $O_1$. It is at this position that the handling member 25 is horizontally rotated around the axis $O_1$. Thus, the above closer position of the handling member 25 will be referred to as "horizontal rotating position" hereinafter.

As is easily understood, it is also possible to bring the handling member 25 away from the horizontal rotating position back to the initial position (indicated in solid lines in FIG. 1). To this end, the first driving device 15 is actuated counterclockwise, while the second driving device 16 is actuated clockwise in a synchronous manner. Upon this operation, the first arm link 21 is caused to pivot counterclockwise about the axis $O_1$, while the other first arm link 22 pivots clockwise about the same axis. In this movement, the inner ends of the second arm links 23 and 24 are brought closer to each other. As a result, the handling member 25 is moved away from the axis $O_1$. When the handling member 25 gets back to the initial position, the first and second driving devices 15–16 are turned off.

Next, description will now be made to the horizontal rotating operation of the first handling member 25.

The first handling member 25 is assumed to be at the horizontal rotating position. When the first and second driving devices 15 and 16 are actuated synchronously in a same direction (clockwise or counterclockwise), the first arm links 21 and 22 are both caused to pivot about the axis $O_1$ in that direction. As a result, the first handling member 25 carried by the second arm links 23 and 24 is rotated about the axis $O_1$, while keeping a constant distance with respect to the axis $O_1$. When the first handling member 25 is rotated about the axis $O_1$ to a predetermined extent, the first and second driving devices 15 and 16 are turned off.

Thereafter, the handling member 25 will be moved away from the axis $O_1$ by actuating the first and second driving devices 15 and 16 in the opposite directions. As a result, the handling member 25 is brought to a position at which a workpiece to be transferred is placed on or discharged from the handling member. Then, the handling member 25 is drawn back to the horizontal rotating position again for another required rotation.

The second arm mechanism 53 is operated in a similar way but independently of the first arm mechanism by actuating the third and fourth driving devices 17 and 18. It is advantageous that the first and second arm mechanisms 33 and 53 do not interfere with each other during their operation since the two mechanisms are spaced vertically.

According to the present invention, the first to fourth shafts 15–18 are rotated coaxially about the common vertical axis. Therefore, the bearings and the magnetic fluid seals for the first to fourth shafts 15–18 are advantageously reduced in diameter. Thus, the overall size of the transfer robot and consequently the price of the robot are also reduced.

Further, according to the present invention, the first and second handling members 25 and 45 are closely located to each other to have a small distance $H_1$ (FIG. 3) between the upper surface of the second handling member 45 and the lower surface of the first handling member 25. This feature is advantageous in that every vacuum processing chamber arranged around the robot does not have to have a large insertion window for allowing passage of the handling members 25 and 45 into the chamber.

According to the present invention, the first and second handling members 25 and 45 can be actuated independently of each other. Thus, each of the first and second handling members, in starting operation, does not have to wait for the other handling member to stop operation. As a result, a plurality of workpieces are advantageously handled by the handling members in transferring to and from the processing chambers without wasting time. Thus, productivity is remarkably improved.

Further, since the driving devices 15–18 are attached to the base frame 1, the first and second handling members 25 and 45 can be rotated about the axis $O_1$ through desired angles. Thus, unlike the prior art, the robot of the present invention requires no sensor or the like for monitoring the rotation angle of the handling members. Therefore, the robot of the present invention is more readily used than the prior art device.

The preferred embodiment of the present invention being thus described, it is obvious that the same may be varied in many ways.

Such variations are not to be regarded as a departure from the spirit and scope of the present invention, and all such modifications as would be obvious to those skilled in the art are intended to be included within the scope of the following claims.

What is claimed is:

1. A two-armed transfer robot comprising:

a first arm mechanism and a second arm mechanism, each arm mechanism being provided at an extremity thereof with a handling member for carrying a workpiece to be processed, the handling member arranged to linearly move in a horizontal plane as well as rotate in the horizontal plane;

a stationary base member;

first to fourth shafts rotatable about a single vertical axis common to the first to the fourth shafts, each shaft being supported by the base member;

first to fourth driving devices associated with the first to fourth shafts, respectively, each driving device being attached to the base member; and a first controlling unit and a second controlling unit;

wherein the first arm mechanism includes a pair of first arm links each having a base end and an extremity, a pair of second arm links each having a base end and an extremity, a first bearing-connector mechanism, and a first handling member, the base ends of the first arm links being connected respectively to the first shaft and the second shaft, the base ends of the second arm links being connected respectively to the extremities of the first arm links for pivotal movement around vertical axes, the extremity of each second arm link being provided with a rack, the first handling member being connected to the extremities of the respective second arm links via the first bearing-connector mechanism in a manner that the racks of the respective second arm links are held in mesh with each other;

the second arm mechanism including a pair of third arm links each being substantially identical to the first arm links and having a base end and an extremity, a pair of fourth arm links each being substantially identical to the second arm links and having a base end and an extremity, a second bearing-connector mechanism, and a second handling member, the base ends of the third arm links being connected respectively to the third shaft and the fourth shaft, the base ends of the fourth arm links being connected respectively to the extremities of the third arm links for pivotal movement around vertical axes, the extremity of each fourth arm link being provided with a rack, the second handling member being connected to the extremities of the respective fourth arm links via the second bearing-connector mechanism in a manner that the racks of the respective fourth arm links are held in mesh with each other;

the first controlling unit used for synchronously actuating the first driving device and the second driving device in a same direction as well as opposite directions;

the second controlling unit used for synchronously actuating the third driving device and the fourth driving device in a same direction as well as opposite directions; and the first arm links being vertically spaced from the third arm links, the second arm links being spaced from but held in a close vertical facing relation to the fourth arm links, the first handling member being spaced from but held in a close vertical facing relation to the second handling member, so that the first and the second handling members are prevented from interfering with each other when moving linearly and around said single vertical axis; and wherein each bearing-connector mechanism provided at the extremity of a corresponding arm link is made small in thickness and includes a through-hole vertically extending through the extremity of the corresponding arm link, a circular plate smaller in diameter than the through-hole so the plate is inserted into the through-hole, a circular groove formed between an inner wall of the through-hole and an outer wall of the circular plate when the plate is held in the through-hole, a passage formed at the extremity of the corresponding arm link to communicate with the circular groove, a plurality of balls inserted into the circular groove via the passage, and a stopper to block the passage for preventing the inserted balls from coming out.

2. The transfer robot according to claim 1, wherein each of the first to fourth shafts is rotatably supported via a magnetic fluid seal for hermetic sealing.

* * * * *